United States Patent
Hayami

(10) Patent No.: US 9,026,880 B2
(45) Date of Patent: May 5, 2015

(54) DECODING APPARATUS AND DECODING METHOD FOR DECODING LDPC-ENCODED DATA

(71) Applicant: JVC Kenwood Corporation, Yokohama (JP)

(72) Inventor: Atsushi Hayami, Yokohama (JP)

(*) Notice: Subject to any disclaimer, the term of this patent is extended or adjusted under 35 U.S.C. 154(b) by 134 days.

(21) Appl. No.: 13/871,901

(22) Filed: Apr. 26, 2013

(65) Prior Publication Data

US 2013/0238950 A1 Sep. 12, 2013

Related U.S. Application Data

(63) Continuation of application No. PCT/JP2011/006039, filed on Oct. 28, 2011.

(30) Foreign Application Priority Data

Oct. 29, 2010 (JP) ................... 2010-244519

(51) Int. Cl.
*H03M 13/00* (2006.01)
*H03M 13/03* (2006.01)
(Continued)

(52) U.S. Cl.
CPC ............ *H03M 13/07* (2013.01); *H03M 13/118* (2013.01); *H03M 13/1137* (2013.01);
(Continued)

(58) Field of Classification Search
CPC .......... H03M 13/1117; H03M 13/112; H03M 13/114; H03M 13/07; H03M 13/09; H03M 13/1162; H03M 13/2906; H03M 13/658; H03M 13/1137; H03M 13/118; H03M 13/1185; H03M 13/1188; H03M 13/3911; H03M 13/6583; H04L 1/005; H04L 1/0057
USPC ................ 714/752, 758, 774, 786, 794, 799; 341/107, 50; 370/241, 242; 375/224, 375/341; 455/423
See application file for complete search history.

(56) References Cited

U.S. PATENT DOCUMENTS 7,139,959 B2 * 11/2006 Hocevar ......................... 714/752
7,415,079 B2 * 8/2008 Cameron et al. .............. 375/340
(Continued)

FOREIGN PATENT DOCUMENTS

| JP | 2006-279396 | 10/2006 |
|---|---|---|
| JP | 2010-245736 | 10/2010 |
| WO | WO-2006/059688 A1 | 6/2006 |

OTHER PUBLICATIONS

Jiang, Advanced Channel Coding Techniques Using Bit-Level Soft Information, Aug. 2007, Texas A&M University, pp. 1-132.*

(Continued)

*Primary Examiner* — John J Tabone, Jr.
(74) *Attorney, Agent, or Firm* — Venable LLP; Michael A. Sarton; Tamatane J. Aga

(57) ABSTRACT

A check node processing unit updates an extrinsic value ratio based on a prior value ratio for each row of a parity check matrix with respect to input data. An identifying unit identifies, based on an element of the parity check matrix that can be identified by a row and column associated with the updated extrinsic value ratio, a next-target element in the same column and in a different row. The identifying unit identifies an element to be updated in the next step by the check node processing unit, from among multiple elements included in the same column. A variable node processing unit updates, based on the extrinsic value ratio, a prior value ratio associated with the identified next-target element after the check node processing unit completes the updating of each row. The check node processing unit and the variable node processing unit alternately and iteratively execute their operations.

6 Claims, 15 Drawing Sheets

(51) Int. Cl.
*H04L 1/00* (2006.01)
*H03M 7/00* (2006.01)
*G06F 11/00* (2006.01)
*H04B 17/00* (2006.01)
*H04W 24/00* (2009.01)
*H03M 13/07* (2006.01)
*H03M 13/11* (2006.01)
*H03M 13/39* (2006.01)
*H03M 13/09* (2006.01)
*H03M 13/29* (2006.01)

(52) U.S. Cl.
CPC ...... *H03M13/1188* (2013.01); *H03M 13/1185* (2013.01); *H03M 13/3911* (2013.01); *H04L 1/0057* (2013.01); *H03M 13/6583* (2013.01); *H03M 13/1117* (2013.01); *H03M 13/114* (2013.01); *H03M 13/1162* (2013.01); *H03M 13/09* (2013.01); *H03M 13/112* (2013.01); *H03M 13/2906* (2013.01); *H03M 13/658* (2013.01)

(56) References Cited

U.S. PATENT DOCUMENTS

| | | | | |
|---|---|---|---|---|
| 7,454,685 | B2* | 11/2008 | Kim et al. | 714/758 |
| 7,647,548 | B2* | 1/2010 | Haratsch et al. | 714/800 |
| 7,730,377 | B2* | 6/2010 | Hocevar | 714/752 |
| 8,429,483 | B1* | 4/2013 | Varnica et al. | 714/752 |
| 8,607,115 | B2* | 12/2013 | Gunnam et al. | 714/752 |
| 8,769,382 | B1* | 7/2014 | Varnica et al. | 714/774 |
| 2007/0168833 | A1* | 7/2007 | Lestable et al. | 714/758 |
| 2008/0246639 | A1* | 10/2008 | Sakai et al. | 341/107 |
| 2008/0320374 | A1* | 12/2008 | Prabhakar et al. | 714/801 |
| 2009/0063926 | A1* | 3/2009 | Cho et al. | 714/752 |
| 2009/0070659 | A1* | 3/2009 | Zhong et al. | 714/801 |
| 2010/0042897 | A1* | 2/2010 | Han et al. | 714/752 |
| 2010/0077276 | A1* | 3/2010 | Okamura et al. | 714/752 |
| 2010/0107030 | A1* | 4/2010 | Graef | 714/752 |
| 2010/0131819 | A1* | 5/2010 | Graef | 714/752 |
| 2010/0174965 | A1* | 7/2010 | Sutskover et al. | 714/752 |
| 2010/0275088 | A1* | 10/2010 | Graef | 714/752 |
| 2011/0087933 | A1* | 4/2011 | Varnica et al. | 714/704 |
| 2011/0191653 | A1* | 8/2011 | Zeng et al. | 714/763 |
| 2011/0252286 | A1* | 10/2011 | Li et al. | 714/755 |
| 2011/0264979 | A1* | 10/2011 | Gunnam et al. | 714/752 |
| 2011/0314352 | A1* | 12/2011 | Djordjevic et al. | 714/752 |
| 2012/0054585 | A1* | 3/2012 | Jiang et al. | 714/777 |
| 2012/0284583 | A1* | 11/2012 | Tran et al. | 714/752 |
| 2013/0232389 | A1* | 9/2013 | Varnica et al. | 714/752 |
| 2014/0245110 | A1* | 8/2014 | Murakami | 714/776 |

OTHER PUBLICATIONS

Zhang et al., Iterative Decoding With Replicas, May 2007, IEEE, vol. 53, No. 5, pp. 1644-1663.*
Zhang et al., Quantization Effects in Low-Density Parity-Check Decoders, 2007, IEEE, pp. 6231-6237.*
Wu et al., "Alternate Iteration of Shuffled Belief Propagation Decoding," Proceedings of the 2010 International Conference on Communications and Mobile Computing, vol. 2, pp. 278-281 (2010).
Ueng et al., "A Shuffled Message-Passing Decoding Method for Memory-Based LDPC Decoders," Proceedings of the IEEE International Symposium on Circuits and Systems, pp. 892-895 (2009).
International Search Report in International Application No. PCT/JP2011/006039 dated Nov. 29, 2011.
International Preliminary Report on Patentability and Written Opinion in International Application No. PCT/JP2011/006039 dated May 14, 2013.

* cited by examiner

FIG.2

$$H_{mn} = \begin{bmatrix} 1 & 1 & 1 & 1 & 0 & 0 & 0 & 0 \\ 1 & 0 & 1 & 0 & 1 & 0 & 1 & 0 \\ 0 & 1 & 0 & 1 & 0 & 1 & 0 & 1 \\ 0 & 0 & 0 & 0 & 1 & 1 & 1 & 1 \end{bmatrix}$$

FIG.7

$$\begin{bmatrix} 1 & 1 & 1 & 1 & 1 & 1 \\ 1 & \alpha & \alpha^2 & \alpha^3 & \alpha^4 & \alpha^5 \\ 1 & \alpha^2 & \alpha^4 & \alpha^6 & \alpha^8 & \alpha^{10} \end{bmatrix}$$

|     | COLUMN INDEX C |    |    |    |    |    |
|-----|----|----|----|----|----|----|
|     | 0  | 1  | 2  | 3  | 4  | 5  |
| 0   | 0  | 5  | 10 | 15 | 20 | 25 |
| 1   | 1  | 6  | 11 | 16 | 21 | 26 |
| 2   | 2  | 7  | 12 | 17 | 22 | 27 |
| 3   | 3  | 8  | 13 | 18 | 23 | 28 |
| 4   | 4  | 9  | 14 | 19 | 24 | 29 |
| 5   | 0  | 6  | 12 | 18 | 24 | 25 |
| 6   | 1  | 7  | 13 | 19 | 20 | 26 |
| 7   | 2  | 8  | 14 | 15 | 21 | 27 |
| 8   | 3  | 9  | 10 | 16 | 22 | 28 |
| 9   | 4  | 5  | 11 | 17 | 23 | 29 |
| 10  | 0  | 7  | 14 | 16 | 23 | 25 |
| 11  | 1  | 8  | 10 | 17 | 24 | 26 |
| 12  | 2  | 9  | 11 | 18 | 20 | 27 |
| 13  | 3  | 5  | 12 | 19 | 21 | 28 |
| 14  | 4  | 6  | 13 | 15 | 22 | 29 |

ROW NUMBER (rows 0–14)

|  | ROW INDEX r | | |
|---|---|---|---|
| | 0 | 1 | 2 |
| 0 | 0 | 5 | 10 |
| 1 | 1 | 6 | 11 |
| 2 | 2 | 7 | 12 |
| 3 | 3 | 8 | 13 |
| 4 | 4 | 9 | 14 |
| 5 | 0 | 9 | 13 |
| 6 | 1 | 5 | 14 |
| 7 | 2 | 6 | 10 |
| 8 | 3 | 7 | 11 |
| 9 | 4 | 8 | 12 |
| 10 | 0 | 8 | 11 |
| 11 | 1 | 9 | 12 |
| 12 | 2 | 5 | 13 |
| 13 | 3 | 6 | 14 |
| 14 | 4 | 7 | 10 |
| 15 | 0 | 7 | 14 |
| 16 | 1 | 8 | 10 |
| 17 | 2 | 9 | 11 |
| 18 | 3 | 5 | 12 |
| 19 | 4 | 6 | 13 |
| 20 | 0 | 6 | 12 |
| 21 | 1 | 7 | 13 |
| 22 | 2 | 8 | 14 |
| 23 | 3 | 9 | 10 |
| 24 | 4 | 5 | 11 |
| 25 | 0 | 5 | 10 |
| 26 | 1 | 6 | 11 |
| 27 | 2 | 7 | 12 |
| 28 | 3 | 8 | 13 |
| 29 | 4 | 9 | 14 |

COLUMN NUMBER (leftmost); 60

FIG.12

$$\begin{bmatrix} 1 & 1 & 1 & 1 & 1 & 1 \\ 0 & 1 & \alpha & \alpha^2 & \alpha^3 & \alpha^4 \\ 0 & 0 & 1 & \alpha^2 & \alpha^4 & \alpha^6 \end{bmatrix}$$

COLUMN INDEX C

|  | | 0 | 1 | 2 | 3 | 4 | 5 |
|---|---|---|---|---|---|---|---|
| | 0 | 0 | 5 | 10 | 15 | 20 | 25 |
| | 1 | 1 | 6 | 11 | 16 | 21 | 26 |
| | 2 | 2 | 7 | 12 | 17 | 22 | 27 |
| | 3 | 3 | 8 | 13 | 18 | 23 | 28 |
| | 4 | 4 | 9 | 14 | 19 | 24 | 29 |
| | 5 | 5 | 11 | 17 | 23 | 29 | |
| | 6 | 6 | 12 | 18 | 24 | 25 | |
| ROW NUMBER | 7 | 7 | 13 | 19 | 20 | 26 | |
| | 8 | 8 | 14 | 15 | 21 | 27 | |
| | 9 | 9 | 10 | 16 | 22 | 28 | |
| | 10 | 10 | 17 | 24 | 26 | | |
| | 11 | 11 | 18 | 20 | 27 | | |
| | 12 | 12 | 19 | 21 | 28 | | |
| | 13 | 13 | 15 | 22 | 29 | | |
| | 14 | 14 | 16 | 23 | 25 | | |

|  | ROW INDEX r | | |
|---|---|---|---|
| COLUMN NUMBER | 0 | 1 | 2 |
| 0 | 0 | | |
| 1 | 1 | | |
| 2 | 2 | | |
| 3 | 3 | | |
| 4 | 4 | | |
| 5 | 0 | 5 | |
| 6 | 1 | 6 | |
| 7 | 2 | 7 | |
| 8 | 3 | 8 | |
| 9 | 4 | 9 | |
| 10 | 0 | 9 | 10 |
| 11 | 1 | 5 | 11 |
| 12 | 2 | 6 | 12 |
| 13 | 3 | 7 | 13 |
| 14 | 4 | 8 | 14 |
| 15 | 0 | 8 | 13 |
| 16 | 1 | 9 | 14 |
| 17 | 2 | 5 | 10 |
| 18 | 3 | 6 | 11 |
| 19 | 4 | 7 | 12 |
| 20 | 0 | 7 | 11 |
| 21 | 1 | 8 | 12 |
| 22 | 2 | 9 | 13 |
| 23 | 3 | 5 | 14 |
| 24 | 4 | 6 | 10 |
| 25 | 0 | 6 | 14 |
| 26 | 1 | 7 | 10 |
| 27 | 2 | 8 | 11 |
| 28 | 3 | 9 | 12 |
| 29 | 4 | 5 | 13 |

60

DECODING APPARATUS AND DECODING METHOD FOR DECODING LDPC-ENCODED DATA

BACKGROUND OF THE INVENTION

1. Field of the Invention

The present invention relates to a decoding technique, and particularly to a decoding apparatus and a decoding method for decoding data subjected to LDPC encoding.

2. Description of the Related Art

In recent years, LDPC (Low Density Parity Check Code) has been attracting attention as an error correction code having a strong error correction capability even if a low S/N channel is employed. Thus, LDPC has been applied in many fields. With such LDPC, the data is encoded on the transmitter side using an encoding matrix generated based on a low density check matrix. Here, the "low density check matrix" represents a matrix having elements which are either 1 or 0, wherein the number of "1" elements is small. On the other hand, on the receiver side, the data decoding and parity check are performed based on the check matrix. In particular, by means of iterative decoding such as a BP (Belief Propagation) method or the like, such an arrangement provides improved decoding performance.

With such a decoding method, check node processing, which is decoding using a check matrix in the row direction, and variable node processing, which is decoding using the check matrix in the column direction, are iteratively executed. Known examples of the check node processing include sum-product decoding using a Gallager function or otherwise a hyperbolic function.

With sum-product decoding, a channel value, which can be calculated based on the variance of the transmission channel noise, is used as a prior value. With such sum-product decoding, in the iterative decoding, there is a demand for a technique for reducing the number of times the iterative decoding is executed, so as to provide sum-product decoding having high-speed convergence. In order to meet this demand, the priority level is determined for each check node, and processing is executed for each check node in descending order of the priority level.

As a countermeasure for reducing the number of times the iterative decoding is executed, so as to provide sum-product decoding having high-speed convergence, shuffled decoding is known. With sum-product decoding or the like employing such shuffled decoding, the variable node processing is executed immediately after the check node processing of each row is completed, thereby successively updating the prior value ratios. In contrast, with conventional sum-product decoding, the variable node processing is executed after the check node processing of all the rows of the check matrix is completed. With such shuffled decoding, the check node processing is sequentially executed using the extrinsic value ratios updated in the processing of each check node. Thus, such an arrangement must update the prior value ratios for all the variable nodes associated with the corresponding column. As a result, such an arrangement has a problem of an increased amount of calculation that is proportional to the number of non-zero elements (the column weight) in the column direction.

SUMMARY OF THE INVENTION

The present invention has been made in view of such a situation. Accordingly, it is a general purpose of the present invention to provide a technique for maintaining high-speed calculation convergence while suppressing an increase in the amount of calculation.

In order to solve the aforementioned problem, a decoding apparatus according to an embodiment of the present invention comprises: an input unit configured to receive encoded data as input data; a check node processing unit configured to update an extrinsic value ratio based on a prior value ratio for each row of a parity check matrix with respect to the data input via the input unit; an identifying unit configured to identify, based on an element which is an element of the parity check matrix that can be identified using a row and a column and which is associated with the extrinsic value ratio updated by the check node processing unit, a next-target element in the same column and in a different row; and a variable node processing unit configured to update, based on the extrinsic value ratio, a prior value ratio associated with the next-target element identified by the identifying unit after the check node processing unit completes an updating of each row. The check node processing unit and the variable node processing unit alternately execute their operations in an iterative manner. The identifying unit identifies an element to be updated by the check node processing unit in a next step, from among multiple elements included in the same column.

With such an embodiment, an element to be updated in the next processing by the check node processing unit is identified as a next-target element from among elements included in the same column. Thus, such an arrangement is able to reduce the number of elements to be subjected to the variable node processing.

Also, the parity check matrix employed in the check node processing unit may have a configuration in which multiple fundamental matrixes, each of which is configured as a unit matrix or otherwise as a cyclic shift matrix obtained by cycling a unit matrix, are arranged in a row direction and in a column direction. Also, the identifying unit may identify, in the column direction of the parity check matrix, a next-target element included in a fundamental matrix that differs from a fundamental matrix including the element associated with the extrinsic value ratio updated by the check node processing unit. Such an arrangement identifies a next-target element included in a fundamental matrix that differs from a fundamental matrix including an element associated with the extrinsic value ratio updated by the check node processing unit. Thus, such an arrangement provides processing in units of fundamental matrixes.

Also, the parity check matrix employed by the check node processing unit may include a fundamental matrix configured as a zero matrix. Also, when a fundamental matrix that differs from a fundamental matrix including an element associated with the extrinsic value ratio updated by the check node processing unit is a zero matrix, the identifying unit may stop identification of the next-target element.

With such an arrangement, when such a fundamental matrix that differs from the fundamental matrix including an element associated with the extrinsic value ratio updated by the check node processing is a zero matrix, the identification of a next-target element is stopped. Thus, such an arrangement allows the variable node processing to be executed even if the fundamental matrixes include a zero matrix.

Another embodiment of the present invention relates to a decoding method. The decoding method comprises: inputting encoded data; updating an extrinsic value ratio based on a prior value ratio for each row of a parity check matrix with respect to the input data; identifying, based on an element which is an element of the parity check matrix that can be identified using a row and a column and which is associated with the updated extrinsic value ratio, a next-target element in the same column and in a different row; and updating, based on the extrinsic value ratio, a prior value ratio associated with the identified next-target element after the updating of each row is completed in the updating of the extrinsic value ratio based on the prior value ratio. The updating of the extrinsic value ratio based on the prior value ratio and the updating of the prior value ratio based on the extrinsic value ratio are alternately executed in an iterative manner. In the identifying, an element to be updated in a next step in which the extrinsic value ratio is updated based on the prior value ratio is identified as the next-target element from among multiple elements included in the same column.

Also, the parity check matrix employed in the updating of the extrinsic value ratio based on the prior value ratio may have a configuration in which multiple fundamental matrixes, each of which is configured as a unit matrix or otherwise as a cyclic shift matrix obtained by cycling a unit matrix, are arranged in a row direction and in a column direction. Also, in the identifying, in the column direction of the parity check matrix, a next-target element may be identified from among elements included in a fundamental matrix that differs from a fundamental matrix including the element associated with the updated extrinsic value ratio.

Also, the parity check matrix employed in the updating of the extrinsic value ratio based on the prior value ratio may include a fundamental matrix configured as a zero matrix. Also, in the identifying, when a fundamental matrix that differs from a fundamental matrix including an element associated with the updated extrinsic value ratio is a zero matrix, the identification of the next-target element may be stopped.

It should be noted that any combination of the aforementioned components and any manifestation of the present invention may be mutually substituted between a method, apparatus, system, recording medium, computer program, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 2 is a diagram showing an example of a check matrix employed by an LDPC encoding unit shown in FIG. 1;

FIG. 7 is a diagram showing a check matrix employed by the communication system shown in FIG. 1;

FIG. 8 is a diagram showing a detailed configuration of the check matrix shown in FIG. 7;

FIG. 9 is a diagram showing a data structure of a column number table stored in an identifying unit shown in FIG. 3;

FIG. 10 is a diagram showing a data structure of a row number table stored in the identifying unit shown in FIG. 3;

FIG. 12 is a diagram showing a check matrix employed by a communication system according to an embodiment 2 of the present invention;

FIG. 13 is a diagram showing a detailed configuration of the check matrix shown in FIG. 12;

FIG. 14 is a diagram showing a data structure of a column number table stored in an identifying unit according to the embodiment 2 of the present invention; and FIG. 15 is a diagram showing a data structure of a row number table stored in the identifying unit according to the embodiment 2 of the present invention.

DETAILED DESCRIPTION OF THE INVENTION

The invention will now be described by reference to the preferred embodiments. This does not intend to limit the scope of the present invention, but to exemplify the invention.

Embodiment 1

Before a specific description of the present invention, description will be made regarding the outline of the present invention. An embodiment 1 of the present invention relates to a communication system including: a transmission apparatus executes LDPC encoding; and a reception apparatus executes iterative decoding of the data (which will be referred to as "encoded data" hereafter) encoded by the transmission apparatus, using a check matrix. In particular, the reception apparatus executes shuffled decoding in the min-sum decoding. Here, the min-sum decoding is configured as simplified sum-product decoding. The min-sum decoding requires only simple functions such as a comparison operation, a sum operation, and the like to execute the check node processing without involving complex functions. With the shuffled decoding, as described above, the variable node processing is executed immediately after the check node processing of each row of the check matrix is completed. However, each column to be subjected to the variable node processing includes multiple elements, leading to an increased amount of calculation. In order to solve such a problem, a communication system, in particular, a reception apparatus, according to the present embodiment executes the following operation.

The reception apparatus executes the check node processing for each of the rows that form a check matrix. The extrinsic value ratios are updated by means of the check node processing, and detailed description thereof will be made later. Next, the reception apparatus identifies a next-target element to be subjected to the next check node processing from among the elements of the column having an element associated with the updated extrinsic value ratio. Here, only a single next-target element is identified from among the elements of the column having an element associated with the updated extrinsic value ratio. Furthermore, the reception apparatus executes the variable node processing of the next-target element thus identified. Subsequently, the reception apparatus switches the row of the check matrix to be processed, and executes the check node processing of the next row. Subsequently, the reception apparatus iteratively executes the check node processing and the variable node processing a predetermined number of times.

Figure 1:
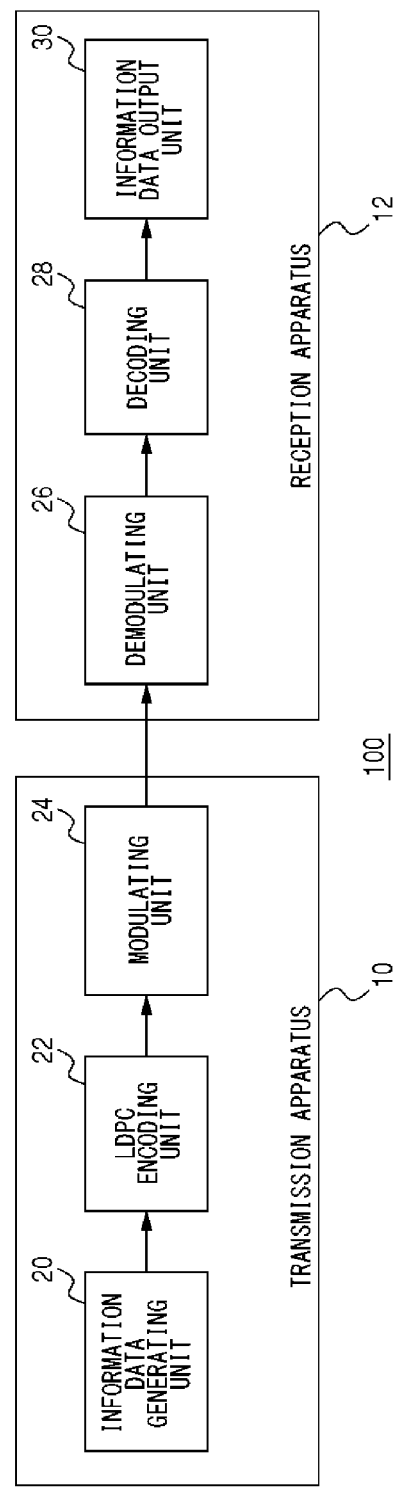
FIG. 1 is a diagram showing a configuration of a communication system according to an embodiment 1 of the present invention.

FIG. 1 shows a configuration of a communication system 100 according to an embodiment 1 of the present invention. A communication system 100 includes a transmission apparatus 10 and a reception apparatus 12. The transmission apparatus 10 includes an information data generating unit 20, an LDPC encoding unit 22, and a modulating unit 24. The reception apparatus 12 includes a demodulating unit 26, a decoding unit 28, and an information data output unit 30.

The information data generating unit 20 acquires the data to be transmitted, and generates information data. It should be noted that the data thus acquired may be used as the information data as it is. The information data generating unit 20 outputs the information data to the LDPC encoding unit 22. The LDPC encoding unit 22 receives the information data from the information data generating unit 20 as the input data. The LDPC encoding unit 22 appends parity data (which will be referred to as "LDPC parity data" hereafter) generated using the LDPC check matrix to the information data. The information data to which the parity data has been appended corresponds to the aforementioned encoded data. The LDPC encoding unit 22 outputs the encoded data to the modulating unit 24. FIG. 2 shows an example of a check matrix used by the LDPC encoding unit 22. The check matrix Hmn is configured as a matrix of m rows and n columns. Here, for clarity of description, description will be made assuming that the check matrix Hmn is configured as a matrix of 4 rows and 8 columns. However, the present invention is not restricted to such an arrangement. Returning to FIG. 1, description will be made.

The modulating unit 24 receives, as the input data, the encoded data from the LDPC encoding unit 22. The modulating unit 24 modulates the encoded data. Examples of modulation schemes which can be used include PSK (Phase Shift Keying), FSK (Frequency Shift Keying), and the like. The modulating unit 24 transmits the encoded data thus modulated as a modulated signal. The demodulating unit 26 receives the modulated signal from the modulating unit 24 via a transmission channel, e.g., via a wireless transmission channel, and demodulates the modulated signal. Known techniques can be applied to the demodulation, and description thereof will be omitted. The demodulating unit 26 outputs the demodulated result (which will be referred to as the "demodulated data" hereafter) to the decoding unit 28.

The decoding unit 28 receives the demodulated data from the demodulating unit 26 as an input signal, and executes iterative decoding processing on the demodulated data using the LDCP check matrix. As the decoding processing, min-sum decoding is executed, for example. Here, in particular, the shuffled decoding is executed in the variable node processing in min-sum decoding. The min-sum decoding is executed according to the following procedure.

1. Initialization: The prior value ratios are initialized, and the maximum number of decoding iterations is set.
2. Check node processing: The extrinsic value ratios are updated in the row direction of the check matrix.
3. Variable node processing: The prior value ratios are updated in the column direction of the check matrix.
4. A temporary estimated word is calculated.

The decoding unit 28 outputs the decoded result (which will be referred to as the "decoded data" hereafter) to the information data output unit 30. The information data output unit 30 receives the decoded data from the decoding unit 28 as the input data, and generates the information data based on the decoded data thus received. It should be noted that the decoded data may be used as the information data as it is. The information data output unit 30 may include an outer-code decoding unit, and may decode an outer code such as CRC (Cyclic Redundancy Check) or the like.

Such a configuration may be realized by means of hardware devices such a CPU, memory, and other LSIs, included in a given computer, or may be realized by means of software components such as a program or the like loaded into memory. Here, a functional block realized by combining such components are shown. Thus, such functional blocks can be realized by hardware components alone, software components alone, or various combinations thereof, which can be readily conceived by those skilled in this art.

Figure 3:
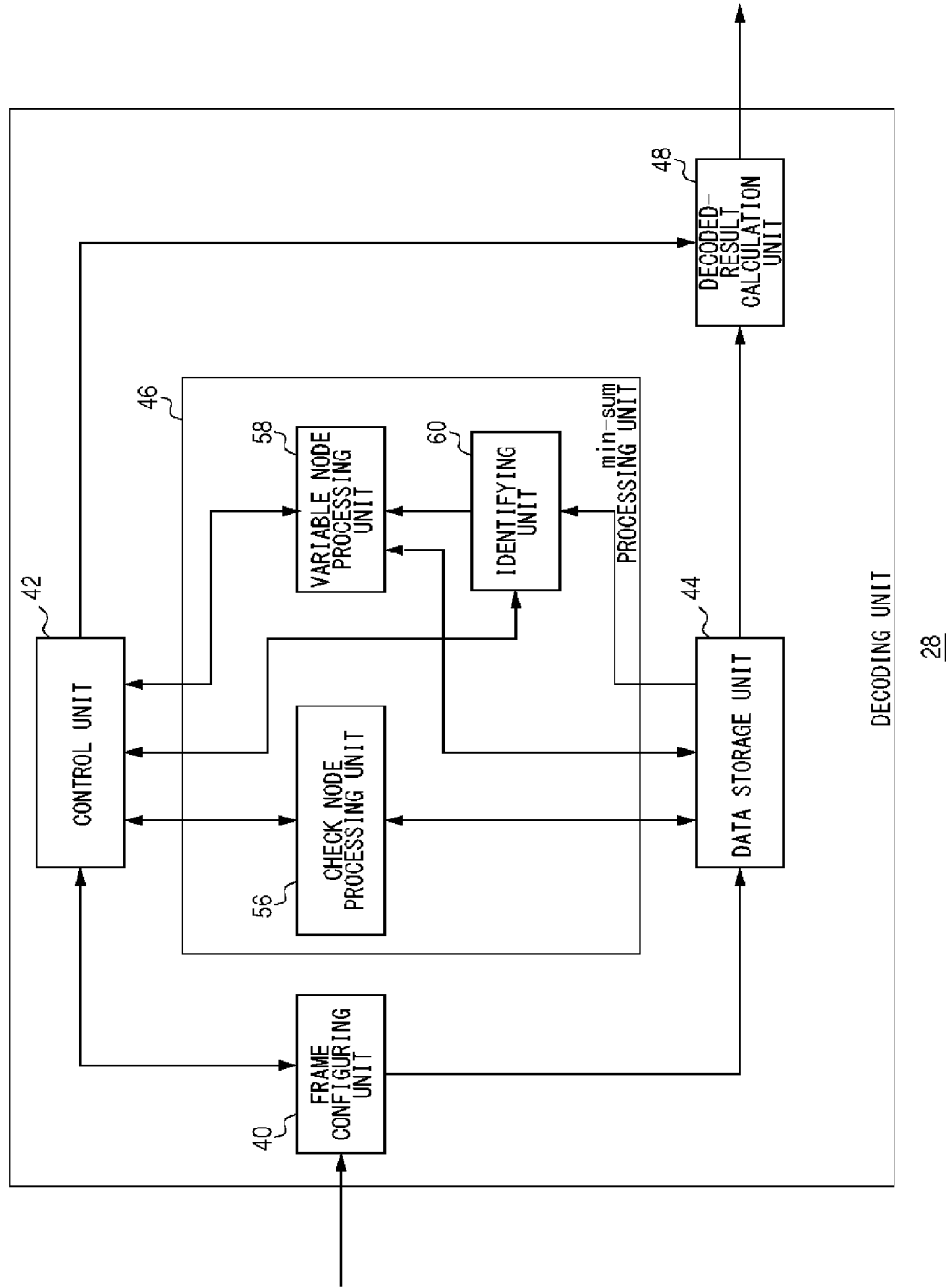
FIG. 3 is a diagram showing a configuration of a decoding unit shown in FIG. 1.

FIG. 3 shows a configuration of the decoding unit 28. The decoding unit 28 includes a frame configuring unit 40, a control unit 42, a data storage unit 44, a min-sum processing unit 46, and a decoded-result calculation unit 48. Furthermore, the min-sum processing unit 46 includes a check node processing unit 56, a variable node processing unit 58, and an identifying unit 60.

The frame configuring unit 40 receives the demodulated data from the unshown demodulating unit 26 as input data. The demodulated data can be said to be LDPC-encoded data that has passed through the transmission channel. The frame configuring unit 40 detects a frame synchronization signal included in the demodulated data, and identifies the unit of the frame to be configured by the demodulated data, based on the frame synchronization signal. For example, in a case in which the frame synchronization signal is arranged at the frame header, and the frame period is configured with a fixed length, the frame configuring unit 40 sets the frame to a fixed-length period after the frame synchronization signal is detected. It should be noted that the unit of the LDPC encoding may be set to a frame. The frame configuring unit instructs the data storage unit 44 to store the demodulated data in units of frames. The data storage unit 44 temporarily stores the demodulated signal in units of frames. Furthermore, the data storage unit 44 stores a table that corresponds to the check matrix. Moreover, the data storage unit 44 stores the extrinsic value ratios which are updated in the check node processing, the prior value ratios which are updated in the variable node processing, and the like.

Figure 4:
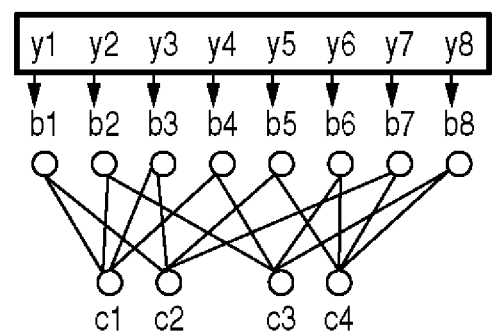
FIG. 4 is a Tanner graph showing a schematic configuration of the operation of the decoding unit shown in FIG. 3.

The min-sum processing unit 46 receives the demodulated data from the data storage unit 44, and executes the min-sum decoding of the demodulated data. With the min-sum decoding, the operation of the check node processing unit 56 and the operation of the variable node processing unit 58 are alternately executed. It should be noted that the min-sum processing unit 46 also executes the shuffled decoding. That is to say, the variable node processing is executed immediately after the check node processing of one row of the check matrix is completed. FIG. 4 shows a Tanner graph showing a schematic configuration of the operation of the decoding unit 28. In the Tanner graph, b1 through b8 each represent a variable node, and c1 through c4 each represent a check node. With the index number of the variable node as n, bn represents the n-th variable node. Furthermore, with the index number of the check node as m, cm represents the m-th check node. The variable nodes b1 through b8 are respectively connected to data y1 through y8 stored in the data storage unit 44 shown in FIG. 3.

N(m) and M(n) are each defined as follows.

$$N(m):=\{n:h_{mn}=1\}$$

$$M(n):=\{m:h_{mn}=1\} \quad (1)$$

Applying the functions defined above to the check matrix shown in FIG. 2, N(m) and M(n) are derived as follows.

N(1)={1, 2, 3, 4}
N(2)={1, 3, 5, 7}
N(3)={2, 4, 6, 8}
N(4)={5, 6, 7, 8}
M(1)={1, 2}
M(2)={1, 3}
M(3)={1, 2}

M(4)={1, 3}
M(5)={2, 4}
M(6)={3, 4}
M(7)={2, 4}
M(8)={3, 4}

Figure 5:
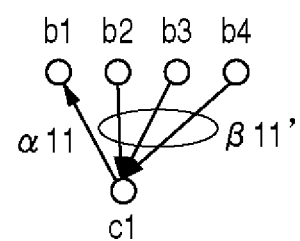
FIG. 5 is a diagram showing a schematic operation for updating an extrinsic value ratio executed by the decoding unit shown in FIG. 3.

In the updating of the extrinsic value ratio αmn in the check node processing, with the Tanner graph in FIG. 1, each extrinsic value ratios αmn are updated using the prior value ratios βmn associated with the variable nodes b1, b2, b3, and b4 connected to the check node c1. For example, the extrinsic value ratio α11 is updated as shown in FIG. 5. FIG. 5 shows a schematic configuration of the extrinsic value ratio updating operation performed by the decoding unit 28. The extrinsic value ratio α11 is updated using the prior value ratios associated with the variable nodes other than b1, i.e., the variable nodes b2, b3, and b4. The check node processing in the min-sum decoding is represented by the following Expression.

$$\alpha_{mn}^{(i)} = a \times \left( \prod_{n' \in N(m) \backslash n} \text{sign}(\varepsilon_{mn'}) \times \min |\varepsilon_{mn'}| \right) \quad (2)$$

$$\varepsilon_{mn'} = \begin{cases} \beta_{mn'}^{(i)} & (n' < n) \\ \beta_{mn'}^{(i-1)} & (n' > n) \end{cases}$$

Here, a represents a normalization constant which is smaller than 1. It should be noted that, in the initialization of the prior value ratios βmn, the prior value ratios βmn may preferably be set to the input data yn. The input data y corresponds to demodulated data. In the sum-product decoding, the i-th check node processing in the iterative decoding is represented by the following Expression.

$$\tau_{mn}^{(i)} \prod_{\substack{n' \in N(m) \backslash n \\ n' < n}} \tanh\left(\frac{\beta_{mn'}^{(i)}}{2}\right) \times \prod_{\substack{n' \in N(m) \backslash n \\ n' > n}} \tanh\left(\frac{\beta_{mn'}^{(i-1)}}{2}\right) \quad (3)$$

$$\alpha_{mn}^{(i)} = \ln \frac{1 + \tau_{mn}^{(i)}}{1 - \tau_{mn}^{(i)}}$$

Figure 6:
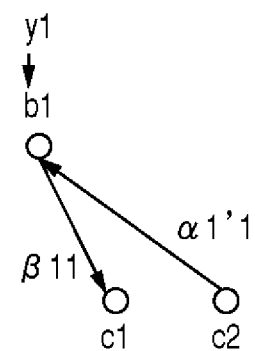
FIG. 6 is a diagram showing a schematic operation for updating a prior value ratio executed by the decoding unit shown in FIG. 3.

The variable node processing is executed for the updated variable nodes, thereby successively updating the prior value ratios βmn according to M(n). In the updating of the prior value ratio βmn in the variable node processing, with the Tanner graph in FIG. 4, the prior value ratio is updated using the extrinsic value ratios associated with the check nodes c1 and c2 connected to the variable node b1. For example, the prior value ratio β11 is updated as shown in FIG. 6. FIG. 6 shows the schematic configuration of the prior value ratio updating operation of the decoding unit 28. Specifically, the prior value ratio β11 is updated using the extrinsic value ratios associated with the check nodes other than c1, i.e., the extrinsic value ratio associated with c2. Such variable node processing is represented by the following Expression.

$$\beta_{mn}^{(i)} = \lambda_n + \sum_{m' \in M(n) \backslash m} \alpha_{m'n}^{(i)} \quad (4)$$

Here, λ is determined using the input data y or otherwise the noise variance of the communication channel and the input data y. Returning to FIG. 3, description will be made.

The check node processing unit 56 updates the extrinsic value ratios based on the prior value ratios for each row of the check matrix with respect to the demodulated data received from the data storage unit 44. The transmission apparatus 10 and the reception apparatus 12 according to the present embodiment employ a check matrix that differs from the check matrix shown in FIG. 2. FIG. 7 shows a check matrix employed in the communication system 100. In the drawing, "1" represents a unit matrix. Furthermore, "α" represents a cyclic matrix obtained by cycling a unit matrix, and "α'" represents a cyclic matrix obtained by cycling a unit matrix by n bits. Here, such a unit matrix and a cyclic matrix are collectively referred to as a "fundamental matrix". That is to say, the fundamental matrix may be configured as either a unit matrix or a cyclic matrix. In a case in which such a unit matrix (block) is defined as a 5×5 matrix, the check matrix can also be represented as shown in FIG. 8.

Figure 8:
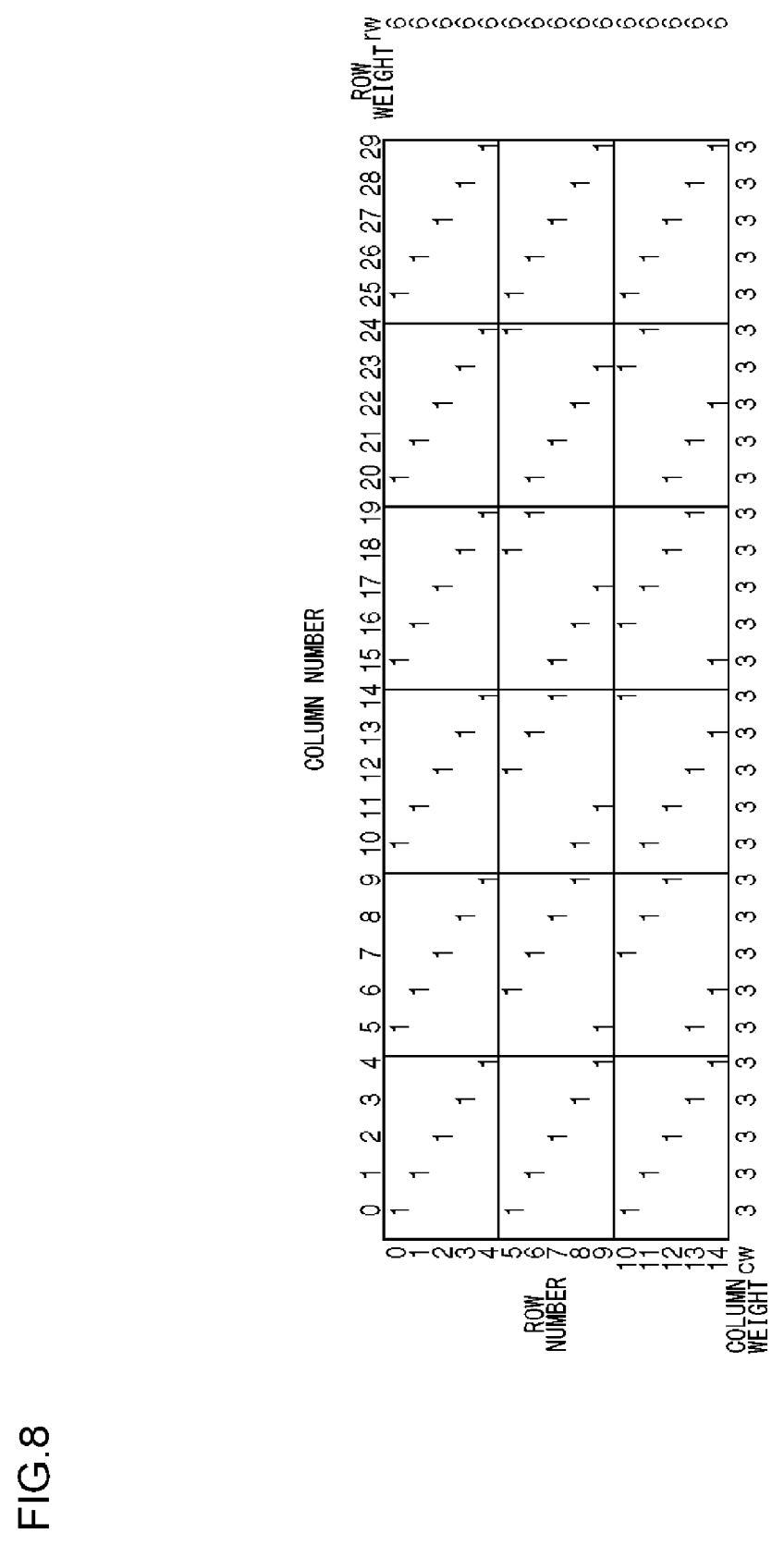

FIG. 8 shows a detailed configuration of the check matrix shown in FIG. 7. It should be noted that each blank element in which "1" is not noted represents a "0" element. As shown in the drawing, the check matrix is composed of three matrix blocks (each having a block length B of 5) in the row direction and of six matrix blocks in the column direction. Each matrix configured as such a block will also be referred to as the "fundamental matrix". In the drawing, the check matrix is shown with a row number which represents the row position, with a column number which represents the column position, with a row weight which represents the number of "1" elements in the row direction, and with a column weight which represents the number of "1" elements in the column direction. Returning to FIG. 3, description will be made.

In a case in which the check matrix shown in FIG. 8 is stored as it is, such an arrangement requires a large storage capacity. Furthermore, such an arrangement leads to a problem of complicated check node processing and complicated variable node processing. In order to solve such a problem, instead of the check matrix, the identifying unit 60 stores a column number table and a row number table. FIG. 9 shows a data structure of the column number table stored in the identifying unit 60. The column number table provides a column index c for each row. The column index c represents the index number which is incremented every time a "1" element appears in the row direction. FIG. 10 shows the data structure of the row number table stored in the identifying unit 60. The row number table provides a row index r for each column. The row index r represents the index number which is incremented every time a "1" element appears in the column direction. Returning to FIG. 3, description will be made.

Based on each element associated with the extrinsic value ratio updated by the check node processing unit 56, the identifying unit 60 identifies a next-target element having a different row index number and having the same column index. The extrinsic value ratio αmn thus updated corresponds to the element at the m-th row and n-th column of the check matrix. The next-target element corresponds to an element which is selected from among multiple elements included in the same column as an element to be updated by the check node processing unit 56 in the next step.

Specific description will be made regarding such an operation. Description will be made assuming that the check node processing unit 56 has completed the processing of the first row (m=0). In this stage, the extrinsic value ratios have been updated using the prior value ratios that are associated with the column numbers n={0, 5, 10, 15, 20, 25} that correspond to the column indexes c=0 through 5 shown in FIG. 10. After the check node processing of each row is completed, the identifying unit 60 detects the row positions each of which is associated with the prior value ratio to be updated after the check node processing is completed, based on the column position and the row position of each element that has been subjected to the check node processing.

The identifying unit 60 divides the row position of an element that has been processed by the check node processing unit 56 by the block length (B), and adds 1 to the integer part of the divided result, so as to derive the row index r as represented by the following Expression. It should be noted that, when r is equal to the row weight, r is set to 0.

$$r=\text{floor}\{(m=0)/(B=5)\}+1=1 \quad (5)$$

Here, "floor" represents a function for rounding the input value down to an integer.

For example, the identifying unit 60 extracts the items that correspond to the row index r=1 and that respectively correspond to the column numbers n={0, 5, 10, 15, 20, 25} from the row number table, thereby identifying m={5, 9, 8, 7, 6, 5}. That is to say, after the check node processing is executed for the first row, the identifying unit 60 identifies the elements (m, n) based upon the row index r=1. In this case, the elements (m, n) thus identified are (5, 0), (9, 5), (8, 10), (7, 15), (6, 20), and (5, 25).

In the same way, after the check node processing of the elements having a row number of 10 and respectively having column numbers n={0, 7, 14, 16, 23, 25} is completed, the identifying unit 60 derives r=3. In this case, the row index r is equal to the column weight. Accordingly, the identifying unit 60 sets the row index r to 0. The identifying unit 60 extracts the items that correspond to the row index r=0 and that respectively correspond to the column numbers n={0, 7, 14, 16, 23, 25} from the row number table, thereby identifying m={0, 2, 4, 1, 3, 0}. With such an arrangement, when r is equal to the column weight, r is set to 0. This is because the row index r is provided in order to acquire the prior value ratios to be updated in the next iterative decoding. That is to say, the identifying unit 60 identifies a next-target element which is included in a fundamental matrix that differs from a fundamental matrix including the element associated with the extrinsic value ratio that has been updated by the check node processing unit 56.

After the check node processing unit 56 completes the updating operation of each row, the variable node processing unit 58 updates the prior value ratios based on the extrinsic value ratios according to Expression (4) for the next-target elements identified by the identifying unit 60. That is to say, the prior value ratios βmn to be updated by the variable node processing unit 58 are limited to the next-target elements identified by the identifying unit 60. As described above, the next-target elements identified by the identifying unit 60 each correspond to a variable node associated with the prior value ratio to be used to update the extrinsic value ratio in the subsequent check node processing. That is to say, such an arrangement derives only the prior value ratios to be used in the subsequent check node processing.

The control unit 42 instructs the check node processing unit 56 and the variable node processing unit 58 to alternately perform their operations. That is to say, the check node processing unit 56 and the variable node processing unit 58 repeat their operations until the processing of the last row is completed, thereby completing the iterative decoding once. Subsequently, the control unit 42 instructs the check node processing unit 56 and the variable node processing unit 58 to perform the next iterative decoding. The control unit 42 instructs the check node processing unit 56 and the variable node processing unit 58 to perform such iterative decoding. When the number of times the iterative decoding has been executed reaches a predetermined number of iterations, the control unit 42 ends the decoding processing.

After the operation of the check node processing unit 56 and the operation of the variable node processing unit 58 are executed iteratively a predetermined number of times, the decoded-result calculation unit 48 calculates the temporary estimated word. It should be noted that, when the result of the parity check is correct, the decoded-result calculation unit 48 may calculate the temporary estimated word, even before the aforementioned operations are performed iteratively the predetermined number of times. The decoded-result calculation unit 48 outputs the temporary estimated word as the decoded result.

Figure 11:
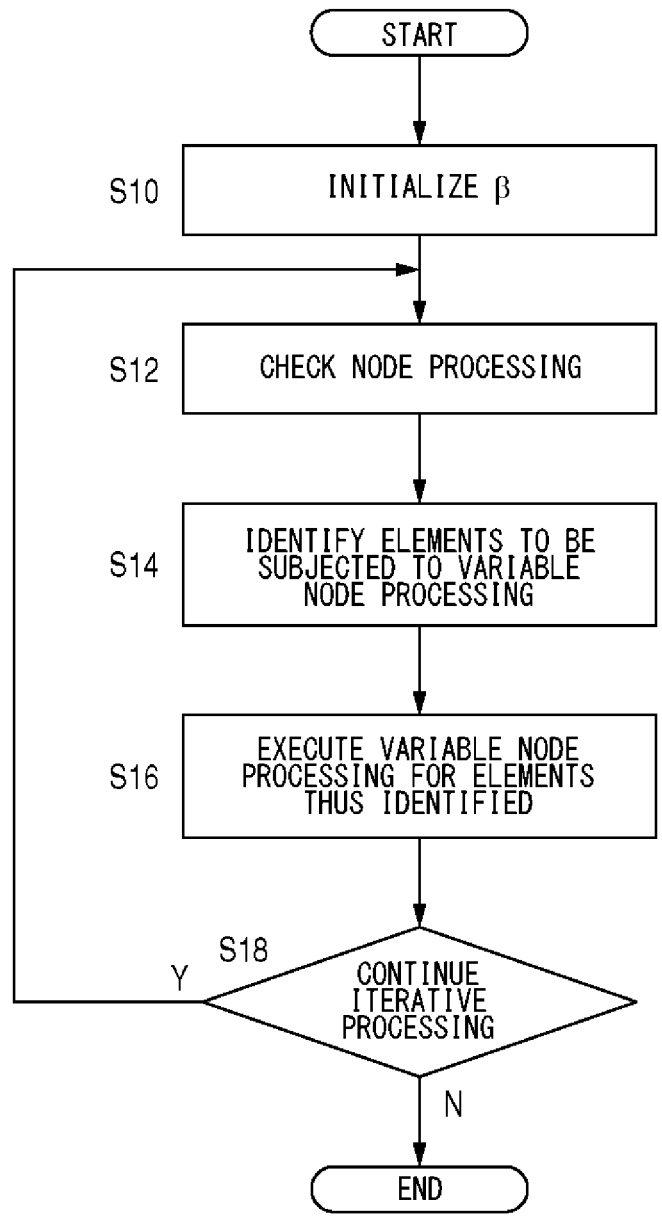
FIG. 11 is a flowchart showing a decoding procedure executed by the decoding unit shown in FIG. 3.

Description will be made regarding the operation of the communication system 100 having the aforementioned configuration. FIG. 11 is a flowchart showing a decoding procedure executed by the decoding unit 28. The check node processing unit 56 initializes the prior value ratios β (S10), and executes the check node processing (S12). The identifying unit 60 identifies the next-target elements to be subjected to the variable node processing (S14). The variable node processing unit 58 executes the variable node processing of the next-target elements thus identified (S16). When the iterative processing is to be continued ("Y" in S18), the control unit 42 controls the flow to return to Step 12. On the other hand, when the iterative processing is not to be continued ("N" in S18), the control unit 42 ends the processing.

With the embodiment of the present invention, such an arrangement identifies a next-target element to be subjected to the next check node processing from among multiple elements included in the same column as that of an element that has been subjected to the check node processing. Thus, such an arrangement provides a reduced number of elements to be subjected to the variable node processing. With such an arrangement, the number of elements to be subjected to the variable node processing is reduced, thereby reducing the calculation amount required for the shuffled decoding. Such a reduction in the calculation amount required for the shuffled decoding provides high-speed convergence while suppressing an increase in the calculation amount. Furthermore, by identifying a next-target element for each fundamental matrix, such an arrangement provides processing in units of fundamental matrixes. Such processing executed in units of fundamental matrixes provides a reduced amount of calculation. Moreover, the row to be subjected to the variable node processing after the check node processing is limited to a single row, thereby reducing the amount of calculation to the reciprocal of the column weight.

Embodiment 2

Next, description will be made regarding an embodiment 2 of the present invention. The embodiment 2 of the present invention relates to a reception apparatus executes the shuffled decoding in the min-sum decoding, as with the embodiment 1. The check matrix employed in the embodiment 1 includes rows having the same row weight. In contrast, the check matrix employed in the embodiment 2 includes rows having different respective row weights. With such an arrangement, in some cases, when a next-target element is to be identified after the check node processing of an element included in a given column has been performed, the given column does not have another "1" element. In order to continue the shuffled decoding even in such a situation, the reception apparatus according to the embodiment is configured such that, if the given row does not have another element, the identification is stopped for the given column, and the variable node processing is executed for other columns only. The communication system 100 according to the embodiment 2 is configured as the same type as that shown in FIG. 1. The decoding unit 28 is configured as the same type as that shown in FIG. 3. Description will be made directing attention to the difference between them.

Figure 13:
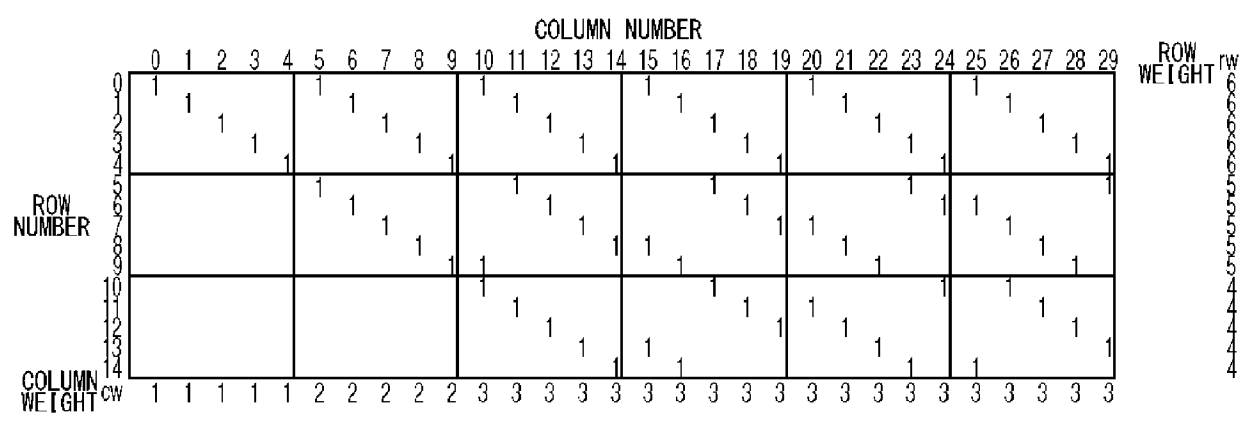

FIG. 12 shows a check matrix employed in a communication system 100 according to the embodiment 2 of the present invention. In the drawing, "0" represents a zero matrix. FIG. 12 is shown in the same manner as is FIG. 7. FIG. 13 is a diagram showing a detailed configuration of the check matrix shown in FIG. 12. FIG. 13 is shown in the same manner as is FIG. 8. An identifying unit 60 stores a column number table and a row number table. FIG. 14 shows a data structure of the column number table stored in the identifying unit 60 according to the embodiment 2 of the present invention. FIG. 15 shows a data structure of the row number table stored in the identifying unit 60 according to the embodiment 2 of the present invention. These drawings are shown in the same manner as are FIGS. 9 and 10, respectively. Returning to FIG. 3, description will be made.

In a case of employing the check matrix shown in FIG. 13, the least common multiple of the column weights is 6, and the identifying unit 60 executes identification processing for the column indexes 0 to 5 in an iterative manner. The identifying unit 60 includes a row index counter with "0" as an initial value. When the check node processing is executed for a row while changing the row index as shown in FIG. 15, the row index counter is counted up. That is to say, in a case of employing the check matrix shown in FIG. 13, when the check node processing of the 0-th row, the fifth row, or the tenth row is performed, the identifying unit 60 counts up the row index counter.

For example, description will be made assuming that the check node processing unit 56 has completed the processing of the first row (m=0). In this stage, the check node processing unit 56 updates the extrinsic value ratios using the prior value ratios associated with the column numbers n={0, 5, 10, 15, 20, 25} that respectively correspond to the column indexes c=0 through 5. In this case, the processing of the 0-th row is executed, and, accordingly, the identifying unit 60 counts up the row index counter to 1. The identifying unit 60 extracts, from the row number table, the items that each correspond to the row index r=1 and that respectively correspond to the column numbers n={0, 5, 10, 15, 20, 25}, thereby identifying the row numbers m={5, 9, 8, 7, 6}. That is to say, the identifying unit 60 does not identify a next-target element that corresponds to the row number n=0. That is to say, if a different fundamental matrix that corresponds to a fundamental matrix including an element associated with an extrinsic value ratio that has been updated by the check node processing unit 56 is a zero matrix, the identifying unit 60 stops identification of a next-target element.

With the embodiment of the present invention, if a different fundamental matrix that corresponds to a fundamental matrix including an element associated with an extrinsic value ratio that has been subjected to the check node processing is a zero matrix, the identification of a next-target element is stopped. Thus, such an arrangement is capable of executing the variable node processing even if the fundamental matrixes include zero matrixes. As described above, such an arrangement allows the variable node processing to be executed even if the fundamental matrixes include zero matrixes. Thus, the present embodiment can be applied to various kinds of check matrixes. Furthermore, such an arrangement provides the same level of decoding performance with calculation required for the variable node processing in the LDPC decoding being performed a reduced number of times.

Description has been made regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Description has been made regarding the embodiments of the present invention assuming that the communication system 100 is configured as a wireless communication system. Thus, the transmission apparatus 10 and the reception apparatus 12 are included in the wireless communication apparatus. However, the present invention is not restricted to such an arrangement. Also, an embodiment may be configured assuming that the communication system 100 is configured as a wired communication system. With such an arrangement, the transmission apparatus 10 and the reception apparatus 12 are included in the wired communication apparatus. With the present modification, the present invention can be applied to various kinds of apparatuses.

With the embodiment of the present invention, the reception apparatus 12 executes min-sum decoding. However, the present invention is not restricted to such an arrangement. Also, the reception apparatus 12 may execute sum-product decoding instead of min-sum decoding. With such an arrangement, in the sum-product decoding, shuffled decoding may preferably be executed. The present modification provides improved reception performance.

With the embodiment of the present invention, the communication system 100 employs a check matrix as shown in FIG. 8 or FIG. 13. However, the present invention is not restricted to such an arrangement. Also, the communication system 100 may employ a check matrix such as LDGM or the like using a pseudo-cyclic matrix. The present modification allows various types of check matrixes to be employed.

With the embodiment of the present invention, the transmission apparatus 10 executes LDPC encoding. However, the present invention is not restricted to such an arrangement. Also, the encoding executed by the transmission apparatus 10 is not restricted to LDPC encoding. Rather, various kinds of encoding may be employed as long as the encoded data can be decoded using min-sum decoding or sum-product decoding. With the present modification, the present invention can be applied to various kinds of encoding.

What is claimed is:

1. A decoding apparatus comprising:
   an input unit configured to receive encoded data as input data;
   a check node processing unit configured to update an extrinsic value ratio based on a prior value ratio for each row of a parity check matrix with respect to the data input via the input unit;
   an identifying unit configured to identify, based on an element which is an element of the parity check matrix that can be identified using a row and a column and which is associated with the extrinsic value ratio updated by the check node processing unit, a next-target element in the same column and in a different row; and
   a variable node processing unit configured to update, based on the extrinsic value ratio, a prior value ratio associated with the next-target element identified by the identifying unit after the check node processing unit completes an updating of each row, wherein the check node processing unit and the variable node processing unit alternately execute their operations in an iterative manner, and wherein the identifying unit identifies an element to be updated by the check node processing unit in a next step, from among a plurality of elements included in the same column.

2. The decoding apparatus according to claim 1, wherein the parity check matrix employed in the check node processing unit has a configuration in which a plurality of fundamental matrixes, each of which is configured as a unit matrix or otherwise as a cyclic shift matrix obtained by cycling a unit matrix, are arranged in a row direction and in a column direction, and wherein the identifying unit identifies, in the column direction of the parity check matrix, a next-target element included in a fundamental matrix that differs from a fundamental matrix including the element associated with the extrinsic value ratio updated by the check node processing unit.

3. The decoding apparatus according to claim 2, wherein the parity check matrix employed by the check node processing unit also includes a fundamental matrix configured as a zero matrix, and wherein, when a fundamental matrix that differs from a fundamental matrix including an element associated with the extrinsic value ratio updated by the check node processing unit is a zero matrix, the identifying unit stops identification of the next-target element.

4. A decoding method comprising:
inputting encoded data;
updating an extrinsic value ratio based on a prior value ratio for each row of a parity check matrix with respect to the input data;
identifying, based on an element which is an element of the parity check matrix that can be identified using a row and a column and which is associated with the updated extrinsic value ratio, a next-target element in the same column and in a different row; and
updating, based on the extrinsic value ratio, a prior value ratio associated with the identified next-target element after the updating of each row is completed in the updating of the extrinsic value ratio based on the prior value ratio, wherein the updating of the extrinsic value ratio based on the prior value ratio and the updating of the prior value ratio based on the extrinsic value ratio are alternately executed in an iterative manner, and wherein, in the identifying, an element to be updated in a next step in which the extrinsic value ratio is updated based on the prior value ratio is identified as the next-target element from among a plurality of elements included in the same column.

5. The decoding method according to claim 4, wherein the parity check matrix employed in the updating of the extrinsic value ratio based on the prior value ratio has a configuration in which a plurality of fundamental matrixes, each of which is configured as a unit matrix or otherwise as a cyclic shift matrix obtained by cycling a unit matrix, are arranged in a row direction and in a column direction, and wherein, in the identifying, in the column direction of the parity check matrix, a next-target element is identified from among elements included in a fundamental matrix that differs from a fundamental matrix including the element associated with the updated extrinsic value ratio.

6. The decoding method according to claim 5, wherein the parity check matrix employed in the updating of the extrinsic value ratio based on the prior value ratio also includes a fundamental matrix configured as a zero matrix, and wherein, in the identifying, when a fundamental matrix that differs from a fundamental matrix including an element associated with the updated extrinsic value ratio is a zero matrix, the identification of the next-target element is stopped.

* * * * *